United States Patent [19]

Sabon

[11] 4,318,074
[45] Mar. 2, 1982

[54] CONTACTLESS ELECTROMAGNETIC RELAY

[75] Inventor: Robert J. Sabon, Chicago, Ill.

[73] Assignee: GTE Automatic Electric Labs Inc., Northlake, Ill.

[21] Appl. No.: 196,941

[22] Filed: Oct. 14, 1980

[51] Int. Cl.³ .................................. H01L 43/04
[52] U.S. Cl. ........................ 338/32 H; 323/368; 324/117 H; 335/298
[58] Field of Search ............... 338/32 H, 32 R; 323/368; 335/258; 357/27; 324/251, 252, 235, 117 H, 133; 329/200; 307/278, 239, 309, 116

[56] References Cited

U.S. PATENT DOCUMENTS

| | | | |
|---|---|---|---|
| 3,369,206 | 2/1968 | Lundkvist | 335/298 X |
| 3,781,735 | 12/1973 | Haas | 335/298 |
| 4,218,626 | 8/1980 | Fukuda et al. | 338/32 H X |

Primary Examiner—C. L. Albritton
Attorney, Agent, or Firm—Robert J. Black; Anthony Miologos

[57] ABSTRACT

A contactless electromagnetic relay employing at least two magnetically activated electronic switches comprising a coil for generating a field of magnetic flux in response to an electrical current and a pair of magnetic circuits for conveying the flux to the switches. A first switch is "normally on" and a second "normally off" when no flux is generated by the coil, providing a first switching state. A second switching state is achieved by the relay when the coil generates a magnetic flux sufficient to turn off the first switch and turn on the second switch. Each magnetic circuit includes an adjustable core for increasing or decreasing the amount of flux delivered to each switch.

15 Claims, 7 Drawing Figures

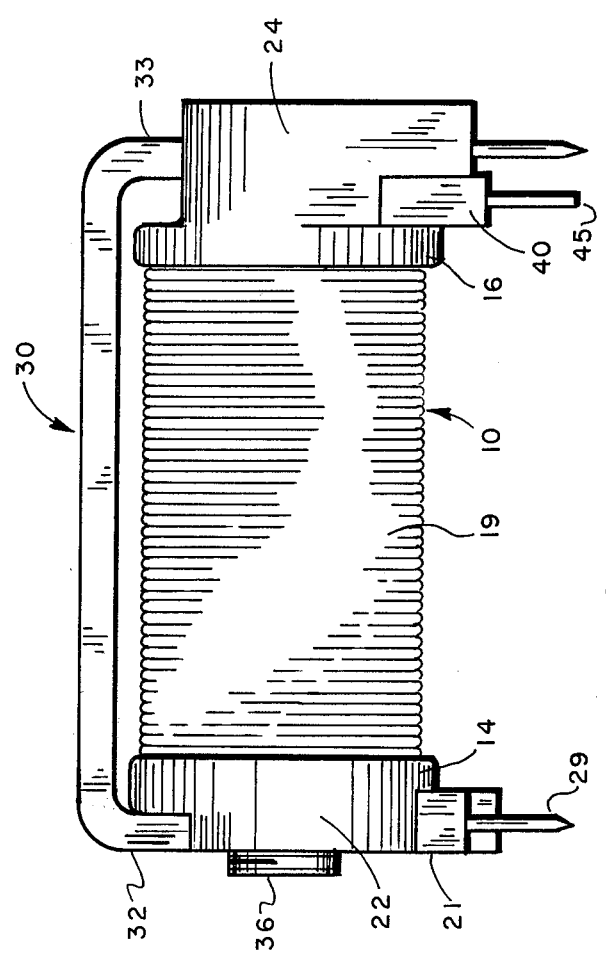

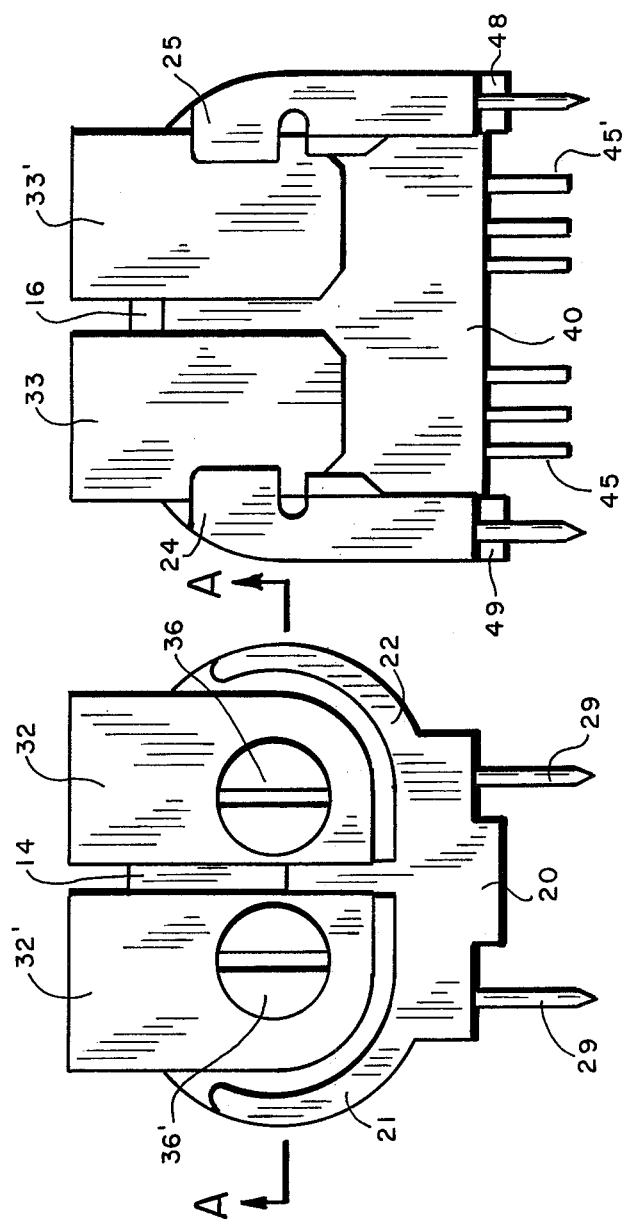

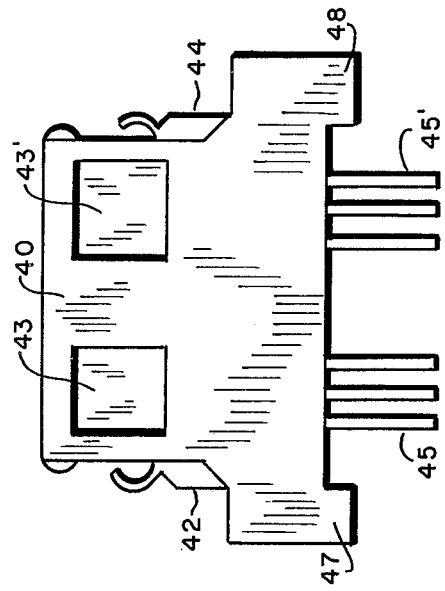
FIG. 5
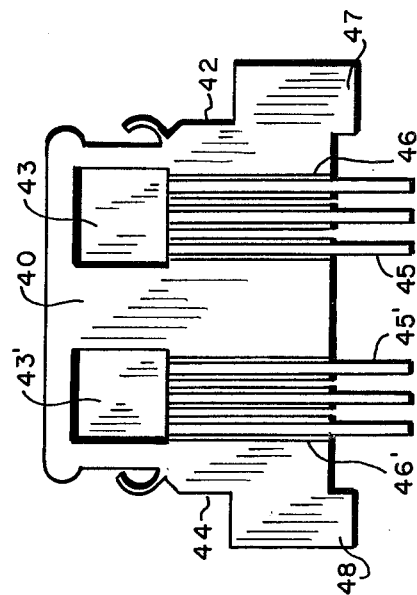
FIG. 6
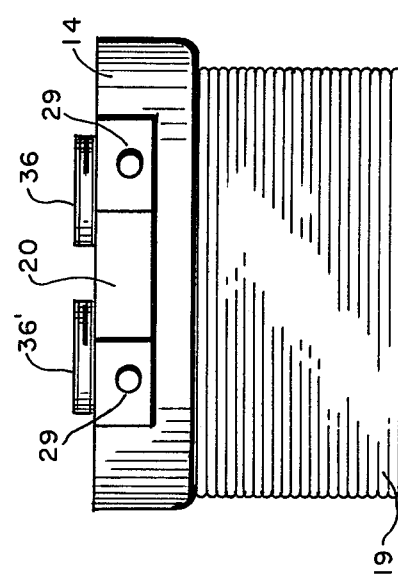
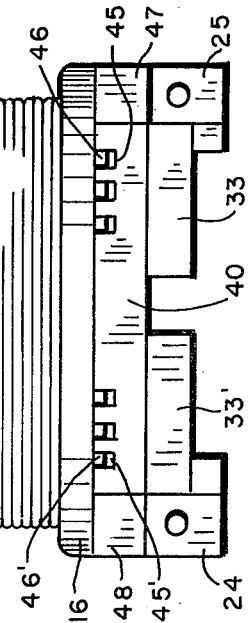
FIG. 4

CONTACTLESS ELECTROMAGNETIC RELAY

BACKGROUND OF THE INVENTION

(1) Field of the Invention

The present invention relates in general to electromagnetic relays and more particularly to a contactless electromagnetic relay employing magnetically activated electronic switches.

(2) Description of the Prior Art

Magnetically activated electronic switches or "Hall effect" digital switches utilize the Hall effect for sensing a magnetic field. That is, a Hall cell included in the switch senses a magnetic field and provides electrical outputs corresponding to the presence or absence of a magnetic flux. Such a Hall effect switch is the Sprague ULS-3006T which other than the Hall cell, includes an amplifier, trigger and output stages integrated into a single monolithic chip. These relatively inexpensive solid state devices are compact and highly reliable. Further, since switching is done without the need of contacts they are not prone to contact bounce and thus are well suited in digital electronic applications.

Operationally these switches are configured in either a normally "off" or a normally "on" configuration. In the normally "off" configuration an output transistor in the output stage of the switch is normally off when the magnetic field perpendicular to the surface of the Hall cell is below a threshold or "operate point". When the field exceeds the "operate point" the output transistor switches on and is capable of sinking a set amount of current. The output transistor switches off when the magnetic field is reduced below the "release point" which is less then the "operate point". The normally "on" devices output transistor sinks current and is on when the magnetic field is below the threshold or "operate point" and switches off when the field exceeds the "operating point". The hysterisis characteristics provide for unambiguous or non-oscillatory switching regardless of the rate of change of the magnetic field.

These devices are finding increased usage as sensor devices which can detect either a current or electrical potential and trigger a signal such as to a digital computer or to an alarm device. Such an application is described in U.S. Pat. No. 4,104,488 titled "Subscriber Line Circuit" to D. A. Weir et al, issued May 19, 1977. The Weir patent teaches Hall effect devices which are incorporated to detect line looping, dialing and ring-trip sensing in a telephone system.

A problem associated with the Hall effect switches is that the sensitivities or the operate and release thresholds of the devices vary from device to device.

This can be solved by purchasing a large number of devices, testing and using only those devices which fit certain circuit characteristics. Or on the other hand designing the circuit characteristics around a specific operate and release sensitivity and fiting the appropriate Hall switch to these characteristics. In any event, these methods are costly and wasteful in both material and engineering which ultimately would make a final product very expensive.

One method of solving this problem and therefore the object of this invention is to provide an electromagnetic device that is capable of varying the amount of magnetic flux delivered to the Hall effect switch in order to tailor the operate sensitivities of the Hall effect switch to the desired operate and a non-operate characteristics of the electromagnetic device.

SUMMARY OF THE INVENTION

The present invention is an electromagnetic device employing a magnetically activated electronic switch or Hall switch to detect the presence or absence of an electrical current and output a corresponding signal.

The device consists of a magnetic flux generator, a magnetic circuit including an adjustable core and a Hall switch.

The magnetic flux generator produces a field of magnetic flux in response to the presence of an electrical current which is transmitted to the Hall switch via the magnetic circuit. The Hall switch is mounted within an air gap formed by the magnetic circuit and adjacent to one end of the adjustable core. The core is disposed to be adjusted toward or away from the switch effectively increasing or decreasing the flux density delivered to the Hall switch. In this manner the operating characteristics of the device may be tailored to the sensitivity of Hall switch.

Depending upon the type of Hall switch used, i.e. "normally on", or "normally off", the Hall switch produces an output signal corresponding to the absence of a magnetic flux and conversely an output signal corresponding to the presence of a magnetic flux.

While the description of a single Hall switch device described above can be used in many applications the availability of Hall switches having various sensitivities can be also used to advantage.

In this case two Hall switches having different operating and release points are mounted on an electromagnetic device having a single flux generator and a magnetic circuit including two adjustable cores. Each Hall switch is situated adjacent a respective core in the same manner as a single Hall switch device. The first Hall switch for example may have an operating point lower than the second, where a current of a first value would activate the first Hall switch and produce an output signal and current of a second higher value activated the first and second Hall switches. Again the adjustable core would tailor the operating characteristics of the device to each of the sensitivities of the Hall switches.

Finally, the availability of the Hall switches in a "normally on" and "normally off" type can be used to advantage in the form of a relay device.

A contactless electromagnetic relay may be fashioned consisting of a single flux generator, two magnetic circuits and at least two Hall switches. The first switch would be a normally on device and the second a normally off. With no current applied the first Hall switch would output a signal corresponding to its on condition and the second device output a signal corresponding to its off condition. Applying a current would turn off the first device again outputting a corresponding off signal and turn on the second device outputting its on signal.

While describing the relay as having two Hall switches any number and type of switches may be employed for particular switching applications. For example, the relay may include three normally on Hall switch types and two normally off or any number of combinations.

BRIEF DESCRIPTION OF THE DRAWINGS

A better understanding of the invention may be had from the consideration of the following detailed description taken in conjunction with the accompanying drawings in which:

FIG. 1 is a side elevational view of a contactless electromagnetic relay in accordance with the present invention described herein.

FIG. 2 is a front end elevational view of the assembled electromagnetic relay.

FIG. 3 is a rear end elevational view of the assembled electromagnetic relay.

FIG. 4 is a bottom view of the assembled electromagnetic relay.

FIG. 5 is a rear elevational view of a magnetically activated electronic switch carrier in accordance with the present invention described herein.

FIG. 6 is a front elevational view of the switch carrier.

DESCRIPTION OF THE PREFERRED EMBODIMENT

Figure 7:
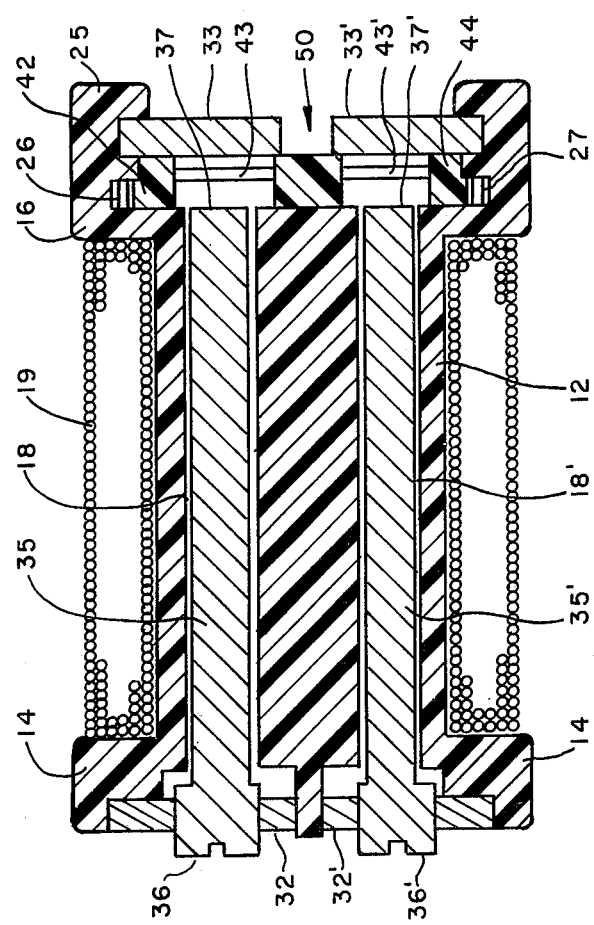
FIG. 7 is a sectional view taken substantially along line A—A of FIG. 2.

Turning now to FIGS. 1 and 7 the device of the present invention includes a magnetic flux generator 10 having a molded bobbin of insulative material and comprised of a body portion 12 and flanges 14 and 16 on opposite ends of the body. A coil of wire 19 is wound about the body portion intermediate flanges 14 and 16. Body portion 12 further includes a pair of longitudinally oriented bores 18 and 18' running through the body portion and both flanges 14 and 16. The exterior surface of flange 14 includes an E-shaped member 20 having arms 21, 22 and 23 integrally molded to its surface forming a pair of receiving areas 51 and 52 as can be seen in FIG. 2. Turning now to FIG. 3 flange 16 includes a pair of L-shaped members 24 and 25 integrally molded and extending outward of an exterior surface of flange 16.

Terminal posts 29 extend from member 20 and are arranged to connect coil 19 to a source of electrical current allowing the flux generator to generate a magnetic field when current is applied.

Returning back to FIGS. 1 and 7, the device further includes a pair of magnetic circuits, each comprised of a U-shaped return strap, generally shown as 30, composed of a suitable conductor material and an associated ferromagnetic core 35 or 35'. A first leg 32, 32' of each return strap 30 is arranged to be held in receiving area 51, 52 respectively, on flange 14. A second leg 33 33' of each return strap 30 is held within a channel 50. Channel 50 is formed by L-shaped arms 24 and 25 of flange 16. Each leg 32, 32' includes a threaded bore centrally located on the leg and arranged to accept a threaded end portion 36, 36' of ferromagnetic cores 35, 35' respectively. This allows cores 35 and 35' to be adjustably housed within bobbin bores 18, 18'.

An air gap is formed in the magnetic circuit between the core end 37, 37' and legs 33, 33' respectively of each return strap 30. The magnetic flux generated by coil 19 is transmitted by each respective core through the associated air gap and back to the cores via each individual return strap. It can be appreciated that by manually adjusting either core threaded portion 36 or 36' the distance between respective core ends 37, 37' and return strap legs 33, 33' can be increased or decreased and thus decreasing or increasing respectively the density of the flux transmitted through the air gap.

The device is completed by a Hall switch carrier 40 illustrated in FIGS. 5 and 6 and comprised of a rectangular body portion including a pair of pockets 43, 43' each having a Hall switch situated therein. Guide arms 42 and 44 positioned on opposite ends of the carrier are arranged to be inserted into channels 26 and 27 formed in L-shaped members 24 and 25. Each guide arm 42 and 44 is inserted into respective channel as seen on FIG. 7. Each guide arm further includes a deflectable finger portion arranged to be bent inward providing friction fit between the carrier ends 42, 44 and channels 26 and 27. The carrier is configured to fit in the air gap between the exterior surface of flange 16 and the interior surface of legs 33, 33'. In this manner the Hall cell included in each of the Hall switches can be precisely positioned perpendicular to the magnetic flux flowing within a respective air gap. Carrier 40 further includes kerfs 46, 46' for extending terminals 45, 45' from respective Hall switches and allowing the Hall switches to be connected to exterior circuitry.

Turning now to FIG. 7 the operation of the device will be explained. The contactless relay is intended to obtain two switching states. That is for a current on condition a first switch is on and the second off allowing the relay to assume a first switching state and for a current off condition the first switch is off and the second on, assuming the second switching state. This is accomplished by employing a "normally off" Hall switch in association with the core 35 and a "normally on" Hall switch with core 35'. It should be noted, that the arrangement described here is for purposes of illustrating the manner of operation for this embodiment and to simplify the operating explanation. It will be appreciated that any number or manner of "normally on" or "normally off" Hall switches may be used for other particular applications.

With electrical current applied to terminals 29 a magnetic field is generated by coil 19 and magnetic flux flows through each magnetic circuit providing the first switching state. The Hall switch associated with core 35, a "normally off" switch outputs a specific signal via terminals 45 corresponding to its on condition and the Hall switch associated with 35' a "normally on" switch outputs a specific signal via terminals 45' corresponding to its off condition. When no electrical current is applied to terminals 29, no magnetic field is generated by coil 19 and thus no magnetic flux flows through each magnetic circuit providing the second switching state. The first Hall switch turns off outputing a signal corresponding to its off condition and the second turns on outputting a signal corresponding to its on condition.

Since Hall switches have operate and release thresholds which vary from device to device the adjustable core of the present invention is capable of varying the amount of magnetic flux delivered to each Hall switch. Threaded portions 36, 36' of cores 35, 35' respectively allow each core to be advanced toward each respective Hall switch or backed away from it. The closer the core portion 37, 37' is to the respective Hall switch the less ampere turns required to turn on the Hall element. The position of each core is set to match the operate sensitivities of the Hall switches each employed to the desired operate and non-operate characteristics of the assembled device.

The adjustable cores may be also used to advantage to vary in flux rapidly in one core and slowly in the other allowing for a set time differential between the turn on and turn off conditions in each switching state.

The present invention has been described with reference to a specific embodiment thereof, for the purpose of illustrating the manner in which the invention may be used to advantage. It would be appreciated by those skilled in the art that the invention is not limited thereto. Accordingly, any and all modifications, variations, or equivalent arrangements which may occur to those skilled in the art should be considered to be within the scope of the invention.

What is claimed:

1. A contactless electromagnetic relay arranged to assume a first switching state responsive to the presence of an electrical current and second switching state responsive to the absence of said electrical current said relay comprising:

flux generating means producing a magnetic flux of a first density in response to the presence of said electrical current;

at least one pair of flux circuit means each situated adjacent said flux generating means and each including an air gap having said flux conveyed therethrough;

at least first and second magnetic switching means each disposed within a different one of said pair of air gaps, responsive to said flux of said first density rendering said first switching means operated and said second switching means non-operated;

whereby, said relay assumes said first switching state.

2. A contactless electromagnetic relay as claimed in claim 1, wherein: said flux generating means produces a magnetic flux of a second density in response to the absence of said electrical current, rendering said first switching means non-operated and said second switching means operated, whereby said relay assumes said second switching state.

3. A contactless electromagnetic relay as claimed in claim 2, wherein: said flux generating means comprises a tubular body portion and first and second axially spaced flanges extending perpendicularly from said body portion at opposite ends thereof, at least a pair of openings spaced equidistant and parallel to each other running through said body portion and each of said flanges and a coil of insulated wire wound about said body portion intermediate said flanges, said coil connected to said electrical current.

4. A contactless electromagnetic relay as claimed in claim 3, wherein: each of said flux circuit means comprises an adjustable ferromagnetic core situated within a respective one of said bobbin openings and each core including a first end extending outward of said first flange and a second end proximate said second flange, a pair of flux return paths disposed adjacent said coil and each including a first end portion mounted to said first flange and a second end portion arranged adjacent to and in a spaced relationship with a respective one of said cores second ends forming first and second air gaps therebetween each of said flux return paths first ends adjustably engaging a respective one of said cores first ends.

5. A contactless electromagnetic relay as claimed in claim 2, wherein: said first and second switching means is comprised of at least first and second Hall effect device switches respectively.

6. A contactless electromagnetic relay as claimed in claim 5, wherein: said first Hall effect device includes an operating threshold and said Hall effect device is rendered operated when said magnetic flux of said first density is equal to or greater than said operating threshold.

7. A contactless electromagnetic relay as claimed in claim 5, wherein: said first Hall effect device includes a release threshold and said Hall effect device is rendered non-operated when said magnetic flux of said second density is equal to or less than said release threshold.

8. A contactless electromagnetic relay as claimed in claim 5, wherein: said second Hall effect device includes an operating threshold and said Hall effect device is rendered operated when said magnetic flux of said second density is equal to or less than said operating threshold.

9. A contactless electromagnetic relay as claimed in claim 5, wherein: said second Hall effect device includes a release threshold and said Hall effect device is rendered non-operated when said magnetic flux of said first density is equal to or greater than said release threshold.

10. A contactless electromagnetic relay arranged to assume a first switching state responsive to the presence of an electrical current and a second switching state responsive to the absence of said electrical current said relay comprising:

a bobbin, including first and second axially spaced flanges extending perpendicularly from opposite ends of said bobbin, said bobbin further including at least first and second bores spaced equidistant and parallel to each other running longitudinally through said bobbin and said flanges and a coil of insulated wire wound about said bobbin intermediate said flanges, said coil connected to said electrical current producing a magnetic flux of a first density in response to the presence of said electrical current;

at least first and second cores, each slideably situated within a respective one of said pair of bores and each including a first threaded end extending outward of said first flange and a second end proximate to said second flange;

at least first and second flux return paths disposed adjacent said coil and each including first and second end portions, each of said first end portions including a threaded aperture and each of said first end portions mounted to said first flange with a respective one of said core threaded first ends engaging a respected aperture and each of said flux return paths second end portions arranged adjacent and in spaced relationship to said second flange forming first and second air gaps therebetween and having said flux conveyed therethrough;

at least first and second Hall effect switches each mounted on a carrier frame, and said carrier frame disposed to be inserted within said air gaps with a respective one of said Hall switches adjacent to a respective one of said first and second cores second ends, said Hall switches responsive to said flux of said first density rendering said first switching means operated and said second switching means non-operated;

whereby, said relay assumes said first switching state.

11. A contactless electromagnetic relay as claimed in claim 10, wherein: said coil produces a magnetic flux of a second density in response to the absence of said electrical current rendering said first Hall switch non-operated and said second Hall switch operated whereby said relay assumes said second switching state.

12. A contactless electromagnetic relay as claimed in claim 11, wherein: said first Hall effect switch includes an operating threshold and said Hall effect switch is operated when said first core is manually adjusted providing a magnetic flux of said first density equal to or greater than said operating threshold.

13. A contactless electromagnetic relay as claimed in claim 11, wherein: said first Hall effect switch includes a release threshold and said first core is adjusted rendering said Hall switch non-operated when said magnetic flux of said second density is equal to or less than said release threshold.

14. A contactless electromagnetic relay as claimed in claim 10, wherein: said second Hall effect switch includes an operating threshold and said Hall effect switch is rendered operated when said core is manually adjusted providing a magnetic flux of said second density equal to or less than said operating threshold.

15. A contactless electromagnetic relay as claimed in claim 11, wherein: said second Hall effect switch includes a release threshold and said Hall effect switch is rendered non-operated when said second core is manually adjusted providing magnetic flux of said first density equal to or greater than said release threshold.

* * * * *